United States Patent [19]

Hajdu et al.

[11] Patent Number: 4,663,240

[45] Date of Patent: May 5, 1987

[54] RFI SHIELDED PLASTIC ARTICLES AND PROCESS FOR MAKING SAME

[75] Inventors: Juan B. Hajdu, Orange; Edwin W. Bastenbeck, Plymouth, both of Conn.

[73] Assignee: Enthone, Incorporated, West Haven, Conn.

[21] Appl. No.: 668,753

[22] Filed: Nov. 6, 1984

[51] Int. Cl.⁴ .............................................. B32B 15/04
[52] U.S. Cl. ................................ 428/545; 174/35 TS; 523/137; 427/123; 427/124; 427/407.1; 427/437; 427/443.1; 428/35; 428/325; 428/327; 428/328; 428/332; 428/334; 428/337; 428/546
[58] Field of Search ................ 428/328, 35, 325, 327, 428/332, 334, 337, 545, 546; 427/123, 124, 407.1, 437, 443.1; 174/35 TS; 252/512, 513, 514; 523/137

[56] References Cited

U.S. PATENT DOCUMENTS

| | | |
|---|---|---|
| 3,745,045 | 7/1973 | Brenneman et al. ............... 427/98 |
| 4,258,100 | 3/1981 | Fujitani et al. .................. 428/315 |
| 4,447,492 | 5/1984 | McKaveney ..................... 428/328 |
| 4,507,359 | 3/1985 | Powers, Jr. ..................... 428/328 |

FOREIGN PATENT DOCUMENTS 2169925A 7/1986 United Kingdom .

Primary Examiner—Theodore E. Pertilla
Attorney, Agent, or Firm—DeLio & Associates

[57] ABSTRACT

An RFI shielded enclosure and a process for making same are disclosed. The process comprises coating at least one surface of the enclosure with a fluid organic binder having a substantial percentage of catalytic particles suspended therein. The particles used cause the electroless deposition of copper or nickel to produce an RFI shielded enclosure having in excess of 40 dB's shielding at frequencies above 10 kiloHertz.

13 Claims, No Drawings

RFI SHIELDED PLASTIC ARTICLES AND PROCESS FOR MAKING SAME

BACKGROUND OF THE INVENTION

The present invention relates to radio frequency interference (RFI) shielded plastic articles and enclosures used for electronic equipment. More particularly it relates to RFI shielded non conductive polymeric enclosures which have such electromagnetic shielding on just one side of said enclosure and a process for making the same.

It if often necessary to provide electromagnetic shielding for polymeric and other electrically non-conductive enclosures used in electronic and radio equipment to prevent radiation such as radio-frequency interference from being emitted from the equipment contained therein. Regulations of the Federal Communication Commission require that certain categories of electronic and computer equipment be enclosed by shields capable of substantially eliminating such RFI above about 10 kiloHertz in frequency.

It is known that electrically conducting materials will effectuate electromagnetic radiation shielding in general and RFI shielding in particular. Accordingly it is common practice to provide a metal coating on enclosures for electronic equipment. Among the techniques known to apply such a coating are the use of electrically conductive paints, flame or arc metal spraying, cathode sputtering, vacuum metallization, the application of metal foils and electroless deposition of one or more metal layers. However, to insure tight bonding of the coating to the underlying non-conductive substrate and enclosure it is usually necessary to pretreat the surface by methods involving abrading, etching and similar surface roughening techniques. If not applied with extreme care, such methods can cause discoloration, cracking, distortion, excessive surface stress and in extreme cases, the total destruction of the underlying substrate structure and/or polymeric enclosure. Further, where the enclosure is to be used in an application where only the inside surface is to be coated and where either the exterior surface appearance is to remain unaltered and/or the dimensional tolerances are a matter of some concern, the exterior must be protected in some fashion so as to preserve its color and surface finish. Where electrolessly deposited metallic coatings are involved, this usually involves the application of a resist or other type of strippable coating which will either prevent deposition on the side not to be altered or allow the removal of any deposits which have been laid down. Such procedures, in addition to increasing the overall costs of producing the shielding also tend to degrade to some degree the protected surface so that the finish and/or color may not be entirely suitable for the intended use. In such cases it is necessary to cover up these differences by one or more secondary operations such as mechanically buffing and/or painting the degraded areas. Such approaches, when they work, tend to considerably increase both the time and cost of producing a finished enclosure.

OBJECTS OF THE INVENTION

It is a primary object of the present invention to provide an improved process for applying RFI shielding to enclosures for electronic equipment.

It is a further object to provide a process for applying RFI shielding to enclosures for electronic equipment wherein said shielding can be safely applied to just one side of said enclosure.

It is still another object to provide a process for applying RFI shielding to enclosure for electronic equipment wherein no surface pretreatment is required.

Another object is to provide a process for applying an electromagnetic shielding material capable of reducing electromagnetic radiation by at least 40 dB's above a frequency of 10 kHZ.

These and other objects, features and advantages of the invention will be apparent from the specification which follows:

SUMMARY OF THE INVENTION

The above objects are met by a process for producing an article or enclosure having electromagnetic/radio frequency shielding, said process comprising:

(a) selecting a suitable electrically nonconductive enclosure, (b) applying to at least one side of said enclosure a primary layer comprising a fluid organic binder having active metal particles dispersed therein, said particles being chosen from the group consisting of nickel, copper, iron, cobalt, gold, silver, platinum, palladium and combinations thereof; and (c) depositing on said primary layer a second layer of a metal chosen from the group consisting of electroless nickel, electroless copper and combinations thereof to provide an enclosure having a shielding of at least 40 dB's against electromagnetic radiation having a frequency greater than 10 kiloHertz.

DETAILED DESCRIPTION OF THE PREFERRED EMBODIMENTS

In the present invention the electrically non-conductive base material used for a given enclosure may comprise any suitable material having the requisite structural strength or other characteristics desirable or necessary for the particular use to which the final product is to be put. Typically, this is a cabinet adapted to receive a radio, computer, microwave oven or similar electronic equipment and can be made of any suitable electrically non-conductive or dielectric material, such as any thermosetting or thermoplastic resin or other suitable material which can be molded to produce finished enclosure. Generally, suitable moldable synthetic organic polymeric, i.e., "plastic" materials such as acrylonitrile-butadiene-styrene (ABS), other synthetic organic polymeric materials such as, without limitation, polystyrene, polyphenylene oxide, and polycarbonate plastics, or any other suitable plastic or reinforced plastic material can be used. Other dielectric materials, such as glass, ceramic, glass fiber, reinforced ceramic, pressed fiber board or composite materials made therefrom are also known to be useful for such purposes and may therefore be used as the base material for the purposes of this invention.

Unlike prior art processes which require that the surface of such materials be etched or mechanically roughened, before being coated, the process of the present invention requires no special surface treatment operation other than the normal cleanup used to remove traces of mold release, oil, dirt and other contamination which may be on the surface to be coated.

To produce the product of the present invention, the enclosure to be shielded is first coated, most usually on its interior surface, with a primary layer comprised of a fluid organic binder said binder having at least about 30% finely divided metallic particles dispersed therein. In one embodiment of the present invention, the binder is an acrylic paint. Those skilled in the art will recognize that other fluid binders such as epoxy, urethane and oil base paints can be used with equal efficacy. The only requirements for the binder are that it provide a uniform suspension of the metallic particles when applied and that, when dry, it both adheres to the surface being coated and that the final metal/binder ratio of the dried paint film be at least about 50%. The paint film thickness is not critical as long as it is in excess of 0.5 mils.

The paint can be applied by any conventional method such as brushing, spraying, dip coating and the like. When spraying is used the paint may be thinned with between about 1:1 to about 1:3 paint/thinner ratio with an organic diluent comprised of relatively volatile compounds including alcohols, esters, ketones and aeromatic compounds such as benzine, toluene, xylene and the like, to achieve a proper consistency for spraying and even coating on the surface being protected.

Suitable metals for use in the primary layer are those known to activate or catalyze the electroless deposition of copper and nickel thereon and include nickel, copper, iron, cobalt, gold, silver, platinum, palladium, and combinations thereof, with nickel and copper particles being preferred. For uniform and complete coverage the particle size should be in the range of about 0.5 and 10 microns after air drying for about 4 hours at room temperature or for about 1 hour at about 140° F., the painted surface is normally ready for further processing.

The process of the present invention further involves laying down a second conductive layer. To prepare the paint layer to receive this added layer, the outmost surface of the paint is first etched with a moderately concentrated caustic rinse to expose at least some of the metal particles embedded therein. With acrylic paint this can be done with a 5–20% by weight alkaline solution, made by dissolving NaOH, $Na_2CO_3$ and the like in water and etching the surface, at a temperature of between about 110° and about 160° F. for between about 2 to 10 and preferably for about 3 to 5 minutes. However, since caustic etches tend to develop an unsatisfactory oxide coating on the freshly exposed particles, this must be followed with a short acid rinse for between about 15 seconds and about 2 minutes to remove said coating. For this, solutions of one or more mineral acids such as sulfuric, hydrochloric, phosphoric and nitric acids in a concentration of between about 10 and about 40 volume percent in water are all satisfactory. After a water rinse the surface is now ready for the application of the final coating.

The second coating applied in the process of the present invention is an electrolessly deposited layer of either copper or nickel using a conventionally supplied electroless plating solution. One such solution for copper is supplied by Enthone Corporation under the trademark designation Enplate CU 9704. A corresponding solution for nickel is marketed under the trademark designation Enplate Ni 422, also by Enthone Corporation. It will be readily understood by those in the art that other solutions adapted to electrolessly deposit copper and nickel on properly prepared surfaces may be utilized for this purpose. For effective shielding this layer should be in the range of between about 40 to about 200 microinches in thickness. This may be achieved with either a single layer of copper or nickel or with a combination of nickel and copper layers to reach the desired thickness.

For the process of the present invention, when using the Enthone produced products noted herein above, the electroless plating of Cu in a temperature range of between about 70° to about 140° F. and nickel in the temperature range of between about 70° to about 200° F. to achieve the thickness range given above has been found to provide adherent deposits having no discernible leakage paths and without introducing any dimensional distortion in the underlying plastic enclosure. It is to be understood that processing time will vary according to solution concentrations used, the plating thickness desired and the processing conditions used.

When RFI shields are applied according to the process as described above, enclosures having at least 40 dB shielding for RFI above about 10 kiloHertz are produced. Where still further levels of shielding are required or where it is necessary to protect the electrolessly deposited layer from environmental or physical attack, such protection can be achieved by electroplating one or more layers of copper, nickel, zinc, tin or alloys thereof onto the electrolessly deposited metallic surface.

Thus it can be seen the present invention provides a durable, effective RFI shielded enclosure with the shielding being applied to just one side thereof.

In order to demonstrate the shielding effectiveness of compositions in accordance with the present invention, a series of plastic test panels were coated in accordance with the process of present invention and tested for the effectiveness in attenuating electromagnetic radiation in the radio-frequency range.

EXAMPLE #1

ABS-Borg Warner Cycolac KJU (FR)

An acrylic paint, containing about 50% by weight nickel particles, said particles having a size range of about 1 to about 5 microns, said paint being diluted with 2 parts of an alcohol/ester thinner, was sprayed onto one side of a test panel to a thickness of between 0.5 and 1 mil at 35 lbs per sq. inch air pressure to produce a dried paint film having a metal to binder ratio of about 70%. The paint was allowed to dry for 4 hours in open air, after which it was etched with a 10% caustic solution at 140° F. for 3 to 5 minutes, said etching being followed by 3 cold water rinses. The etched plate was then deoxidized with an acid rinse composed of 20% by volume $H_2SO_4$ plus 5% by volume HCl solution in water, for 30 seconds followed by 3 more cold water rinses.

The now deoxidized panel was electroless plated in Enplate CU 9704 at 118° to 120° F., said plating being followed by an additional 3 cold water rinses. The copper plated panel was in turn electroless nickel plated using Enplate NI 422 at a pH of 5.0 to 5.2 and a temperature of 135° to 140° F. for 8 to 10 minutes. This was followed by an additional cold water rinse and the finished panel dried. The results obtained were as follows:

| | | | | |
|---|---|---|---|---|
| Cu Thickness | 36 microinches | | | |
| Ni Thickness | 12–15 microinches | | | |
| Ohm's sq. before plating | .574 | | | |
| Ohm's after plating | .033 | | | |
| Frequency (MHz) | 30 | 100 | 300 | 1000 |

| dB Attenuation | >55 | >77 | >73 | >53 |

EXAMPLE 2

ABS-Borg Warner Cyclolac KJM (FR)

The process of example 1 was repeated with the paint being diluted with xylene one part to one part paint and further with the electroless nickel layer being omitted. The panel being sprayed to a paint thickness with 1.2 to 2 mils. The following results were obtained:

| Cu thickness | 126 microinches | | | |
|---|---|---|---|---|
| Ohm's sq. before plating | not taken | | | |
| Ohm's sq. after plating | .015 | | | |
| Frequency (MHz) | 30 | 100 | 300 | 1000 |
| dB Attenuation | >55 | >67 | >75 | >67 |

EXAMPLE 3

Polycarbonate-GE Lexan 500 (FR)

The process of example 1 was repeated with a sprayed paint thickness of 0.8 to 1.0 mils and with the following results being obtained:

| Cu Thickness | 112 microinches | | | |
|---|---|---|---|---|
| Ni Thickness | 12-156 microinches | | | |
| Ohm's sq. before plating | .343 | | | |
| Ohm's sq. after plating | .005 | | | |
| Frequency (MHz) | 30 | 100 | 300 | 1000 |
| dB Attenuation | >55 | >67 | >75 | >76 |

EXAMPLE 4

ABS-Borg Warner Cyclolac KJM (FR)

The process of example 1 was repeated with the diluent being one part of a mixture of 1:1 diacetone alcohol and isopropyl alcohol. No further processing was done. The following results were obtained

| Ohm's sq. | | .125 | | |
|---|---|---|---|---|
| Frequency (MHz) | 30 | 100 | 300 | 1000 |
| dB Attenuation | 50 | 46 | >55 | 50 |

EXAMPLE 5

ABS-Borg Warner Cyclolac KJU (FR)

The process of Example 1 was repeated with the omission of the electroless copper deposition step. The following results being obtained:

| Ni Thickness | 67 microinches | | | |
|---|---|---|---|---|
| Ohm's sq. before plating | .480 | | | |
| Ohm's sq. after plating | .200 | | | |
| Frequency (MHz) | 30 | 100 | 300 | 1000 |
| dB Attenuation | >55 | >55 | >65 | >38 |

EXAMPLE 6

PPE-GE Noryl CRT 200 (FR)

The process of example 1 was repeated with a spray thickness of 2.2 to 2.4 mils

| Cu thickness | 65 microinches | | | |
|---|---|---|---|---|
| Ni thickness | 18-20 microinches | | | |
| Ohm's sq before plating | .175 | | | |
| Ohm's sq after plating | .015 | | | |
| Frequency (MHz) | 30 | 100 | 300 | 1000 |
| dB Attenuation | 55 | >67 | >78 | >71 |

EXAMPLE 7

Borg Warner Cyclolac KJU (FR)

The process of example 1 was repeated with the exception that the paint produced a dried film having a metal to binder ratio of about 80% copper particles having a size range of 1 to 5 microns. The following results were obtained:

| Paint thickness | 3 mils | | | |
|---|---|---|---|---|
| Cu thickness | 11 microinches | | | |
| Ni thickness | 12-18 microinches | | | |
| Ohm's sq before plating | .035 | | | |
| Ohm's sq after plating | .015 | | | |
| Frequency (MHz) | 30 | 100 | 300 | 1000 |
| dB Attenuation | >55 | >67 | >77 | 70 |

It will thus be seen that the objects set forth above, among those made apparent from the preceding description, are efficiently attained and, since certain changes may be made in carrying out the above method (process) and in the article set forth without departing from the spirit and scope of the invention, it is intended that all matter contained in the above description shall be interpreted as illustrative and not in a limiting sense.

It is also to be understood that the following claims are intended to cover all of the generic and specific features of the invention herein described, and all statements of the scope of the invention which, as a matter of language, might be said to fall therebetween.

What is claimed is:

1. A process for producing an article or enclosure having electromagnetic/radio frequency shielding, said process comprising:
   (a) selecting a suitable electrically nonconductive enclosure;
   (b) applying to at least one side of said enclosure a primary layer comprising a fluid organic binder, having active metal particles dispersed therein, said binder being a paint selected from the class of acrylic paints, epoxy paints, urethane paints and oil based paints with said particles being chosen from the group consisting of nickel, copper, iron, cobalt, gold, silver, platinum, palladium and combinations thereof;
   (c) depositing onto said primary layer a second layer of electroless copper; and
   (d) depositing onto said second layer a third layer of metal selected from the group consisting of nickel, copper, zinc, tin and alloys thereof, to provide an enclosure having a shielding of at least 40 dB's against electromagnetic radiation having a frequency greater than 10 kiloHertz.

2. The process of claim 1 wherein said non-conductive enclosure is fabricated from the group consisting of moldable thermosetting resins, moldable thermoplastic resins, reinforced thermosetting resins, reinforced thermoplastic resins, glass, ceramic, glass fiber, reinforced ceramic, pressed fiber board and composite materials made therefrom.

3. The process of claim 1 wherein said primary layer, when dry has a metal to binder ratio of at least about 50%.

4. The process of claim 1 wherein said particles have a size in the range of between about 0.5 and about 10 microns.

5. The process of claim 1 wherein in step b, the thickness of said coating is at least 0.5 mils.

6. The process of claim 1 wherein said primary layer is etched to achieve at least a partial removal of the organic binder in said coating so as to expose at least a portion of said metal particles.

7. The process of claim 6 wherein said exposed metal particles are deoxidized by rinsing the surfaces thereof with an acid solution prior to the performance of step c.

8. The process of claim 1 wherein the combined thickness of the second and third layer is in the range of between about 40 and about 200 microinches.

9. The process of claim 1 wherein the third layer is applied by electroplating.

10. The process of claim 1 wherein the third layer is a layer of electrolessly plated nickel.

11. The process of claim 1 wherein the second layer of electroless copper is at least 11 microinches thick.

12. The process of claim 1 wherein the primary layer is applied by spray-painting the enclosure with the organic binder containing the metal particles.

13. An article or enclosure having electromagnetic/radio frequency shielding, said enclosure being fabricated by a process comprising:
 (a) selecting a suitable electrically nonconductive enclosure;
 (b) applying to at least one side of said enclosure a primary layer comprising a fluid organic binder having active metal particles dispersed therein, said binder being a paint selected from the class of acrylic paints, epoxy paints, urethane paints and oil based paints with said particles being chosen from the group consisting of nickel, copper, iron, cobalt, gold, silver, platinum, palladium and combinations thereof;
 (c) depositing on said primary layer a second layer of electroless copper; and
 (d) depositing onto said second layer a third layer of metal chosen from the group consisting of electroless nickel, electroless copper and combinations thereof to provide an enclosure having a shielding of at least 40 dB's against electromagnetic radiation having a frequency greater than 10 kiloHertz.

* * * * *

UNITED STATES PATENT AND TRADEMARK OFFICE
CERTIFICATE OF CORRECTION

PATENT NO. : 4,663,240
DATED : May 5, 1987
INVENTOR(S) : Juan B. Haydu and Edwin W. Bastenbeck It is certified that error appears in the above-identified patent and that said Letters Patent are hereby corrected as shown below:

In the specifications:

Column 1, line 13, the beginning of the sentence reading "It if" should read -- It is --.

Column 3, line 28, the portion of the sentence reading "in the range of about 0.5 and 10 microns after air drying" should read -- in the range of about 0.5 to 10 microns. After air drying --.

Signed and Sealed this

Twenty-fifth Day of August, 1987

Attest:

DONALD J. QUIGG

Attesting Officer    Commissioner of Patents and Trademarks